United States Patent
Tsutsui

[11] Patent Number: 6,060,730
[45] Date of Patent: May 9, 2000

[54] SEMICONDUCTOR LIGHT EMITTING DEVICE

[75] Inventor: Tsuyoshi Tsutsui, Kyoto, Japan

[73] Assignee: Rohm Co., Ltd., Kyoto, Japan

[21] Appl. No.: 09/110,940

[22] Filed: Jul. 7, 1998

[30] Foreign Application Priority Data

Jul. 10, 1997 [JP] Japan ............................ 9/184851

[51] Int. Cl.[7] .................................................. H01L 29/78
[52] U.S. Cl. ............................ 257/103; 257/94; 257/458
[58] Field of Search ............................ 257/103, 94, 458

[56] References Cited

U.S. PATENT DOCUMENTS

| | | |
|---|---|---|
| 5,825,052 | 10/1998 | Shakuda . |
| 5,838,029 | 11/1998 | Shakuda . |
| 5,909,036 | 6/1999 | Tanaka et al. . |
| 5,909,040 | 6/1999 | Ohba et al. . |
| 5,981,980 | 11/1999 | Miyajima et al. . |

*Primary Examiner*—Stephen D. Meier
*Attorney, Agent, or Firm*—Arent, Fox, Kintner, Plotkin & Kahn PLLC

[57] ABSTRACT

There is provided a semiconductor laminated portion in which gallium nitride based compound semiconductor layers including an n-type layer and a p-type layer are laminated for forming an emitting layer on a substrate. Then, an n-side electrode and a p-side electrode are provided so as to be electrically connected to the n-type layer and p-type layer of the semiconductor laminated portion, respectively. The n-type layer includes at least an n-type first layer and an $n^+$-type second layer so that the carrier concentration of the portion to be provided with the n-side electrode is higher than the carrier concentration of the portion in contact with the emitting layer. Consequently, the ohmic contact characteristics of the n-type layer and n-side electrode are improved to reduce a forward voltage, resulting in a semiconductor light emitting device with high light emitting efficiency.

6 Claims, 2 Drawing Sheets

SEMICONDUCTOR LIGHT EMITTING DEVICE

FIELD OF THE INVENTION

The present invention relates to a semiconductor light emitting device in which a gallium nitride based compound semiconductor layer is laminated on a substrate. More particularly, the present invention relates to a semiconductor light emitting device capable of ensuring a good ohmic contact between an n-side electrode and an n-type layer to reduce a forward voltage.

BACKGROUND OF THE INVENTION

For example, with a semiconductor light emitting device of the blue type, as there is shown a schematic diagram of one example of the light emitting chip thereof (hereinafter, referred to as "LED chip") in FIG. 4, on an insulating substrate 21 made of sapphire, are laminated an n-type layer (cladding layer) 23 obtained by epitaxially growing, for example, an n-type GaN; an active layer 24 made of materials having smaller bandgap energy than that of the cladding layer, for example, an InGaN based (which denotes that the ratio of In to Ga is capable of changing variously, and the same shall apply hereinafter) compound semiconductor; and a p-type layer (cladding layer) 25 made of a p-type GaN. Then, the surface thereof is provided with a p-side electrode 28 so as to be electrically connected to the p-type layer 25 via a diffused metal layer (not shown). An n-side electrode 29 is provided so as to be electrically connected to the n-type layer 23 exposed by etching a part of the laminated semiconductor layers, thereby forming a LED chip.

With this kind of semiconductor light emitting device, the carrier concentrations are set as to be optimized in terms of the carrier confinement effect on the active layer 24 for the n-type layer 23 and the p-type layer 25 sandwiching the active layer 24. For example, the n-type layer 23 is formed with a constant carrier concentration of the order of $10^{18}$ cm$^{-3}$.

As described above, in a conventional semiconductor light emitting device using gallium nitride based compound semiconductor, the carrier concentration of the n-type layer is set at an optimum level for emitting characteristics, and the n-type layer is formed with a uniform carrier concentration from top to bottom thereof. Then, an n-side electrode is provided so as to be in contact with a part of the n-type layer exposed by etching. However, the larger the carrier concentration of the n-type layer on which the n-side electrode is provided is, the more preferable it is for obtaining an ohmic contact with the electrode. It is preferable to be the order of $1 \times 10^9$ cm$^{-3}$, or more. Therefore, if the electrode is formed on the semiconductor layer with a carrier concentration limited from the emitting characteristics as described above, sufficient ohmic contact cannot be obtained, which results in a contributing factor in an increase in forward voltage.

In a conventional semiconductor light emitting device made of, for example, AlGaInP based compound semiconductor, or the like, a semiconductor laminated portion is provided so as to form an emitting layer on a semiconductor substrate. Accordingly, an n-type layer is connected to the semiconductor substrate with a high carrier concentration to provide an electrode on the semiconductor substrate. Therefore, even if the n-type layer is formed in accordance with the optimum carrier concentration for emitting characteristics, no problem will occur. However, the gallium nitride based compound semiconductor is laminated onto a sapphire substrate, and hence the electrode is provided directly on the n-type layer. This entails a problem that an ohmic contact cannot be obtained sufficiently. Further, there is also a disadvantage in that materials for an electrode are limited and covers a limited range of selection thereof in order to ensure a good ohmic contact even a bit in the state where it is difficult to obtain a good ohmic contact.

SUMMARY OF THE INVENTION

The present invention has been achieved in order to overcome such disadvantages. Therefore, it is an object of the present invention to provide a semiconductor light emitting device capable of enhancing the ohmic contact between an n-type layer and an n-side electrode to reduce the forward voltage, while maintaining the optimum carrier concentration for the emitting characteristics in the region in contact with an emitting layer even in a semiconductor light emitting device in which a gallium nitride based compound semiconductor is laminated on an insulating substrate, thereby improving the light emitting efficiency and expanding the range from which materials for an electrode is selected.

The semiconductor light emitting device according to the present invention includes: a substrate; a semiconductor laminated portion in which gallium nitride based compound semiconductor layers including an n-type layer and a p-type layer are laminated so as to form an emitting layer on the substrate; and an n-side electrode and a p-side electrode being provided so as to be electrically connected to the n-type layer and the p-type layer of the semiconductor laminated portion, respectively, wherein the n-type layer is formed so that the carrier concentration of the portion to be provided with the n-side electrode is higher than the carrier concentration of the portion in contact with the emitting layer. With this structure, a good ohmic contact between the n-type layer and the n-side electrode can be ensured without adversely affecting the emitting characteristics to reduce the forward voltage.

The gallium nitride based compound semiconductor herein stated represents a semiconductor made of a compound of Group III element Ga and Group V element N, or the one obtained by substituting other Group III elements such as Al and In for a part of the Group III element Ga, and/or obtained by substituting other Group V elements such as P and As for a part of Group V element N. Also, the emitting layer denotes an active layer in a double hetero structure in which the active layer is sandwiched between an n-type layer and a p-type layer, while it denotes an emitting region in the vicinity of a pn junction in a pn junction structure.

The n-side electrode is provided on the n-type layer of the region with a high carrier concentration exposed by etching a part of the laminated semiconductor layers across the emitting layer. Alternatively, the n-side electrode is provided on the n-type layer of the region with a high carrier concentration exposed by etching at least a part of the substrate on which the semiconductor laminated portion is formed. When the substrate is removed, the buffer layer is also removed by etching in the case where the buffer layer with a small carrier concentration exists on the substrate.

The n-type layer is formed so that the carrier concentration of the emitting layer side of the n-type layer is, for example, in the range of $1 \times 10^{18}$ to $9 \times 10^{18}$ cm$^{-3}$, preferably $1 \times 10^{18}$ to $3 \times 10^{18}$ cm$^{-3}$, while the carrier concentration of the n-type layer to be provided with the n-side electrode is, for example, in the range of $1 \times 10^{19}$ to $5 \times 10^{19}$ cm$^{-3}$.

Such a structure can be also adopted in which a metal substrate is provided so as to be electrically connected to the p-type layer side of the semiconductor laminated portion to be the p-side electrode, while the entire surface of the n-type layer with a high carrier concentration is exposed to be provided with the n-side electrode thereon.

BRIEF DISCRIPTION OF THE DRAWINGS

DETAILED DESCRIPTION

Figure 1:
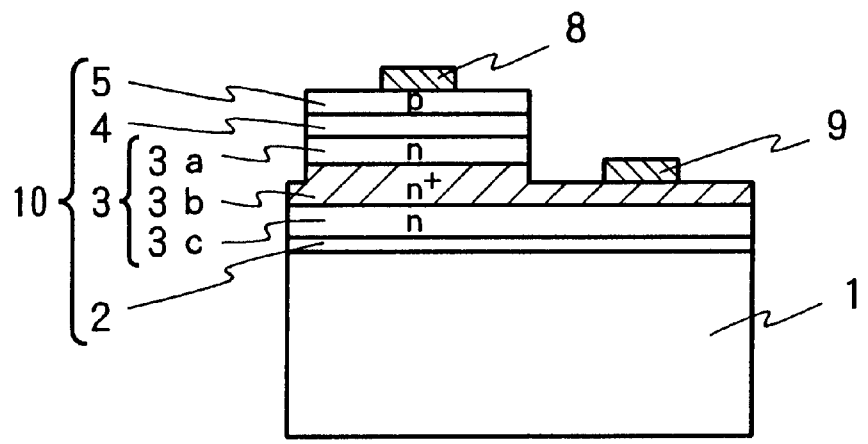
FIG. 1 shows a cross-sectional view illustrating a LED chip of one embodiment of a semiconductor light emitting device of the present invention.

With a semiconductor light emitting device of the present invention, for example, as shown in FIG. 1, a semiconductor laminated portion 10 to form an emitting layer is formed on the surface of an insulating substrate 1 made of sapphire ($Al_2O_3$ single crystal), or the like. To a p-type layer 5 on the surface side, a p-side electrode 8 is electrically connected via a diffused metal layer (not shown). An n-side electrode 9 is formed so as to be electrically connected to an n-type layer 3 being exposed by removing a part of the semiconductor laminated portion 10. The present invention is characterized in that, for example, as shown in FIG. 1, the n-type layer 3 is made of an n-type first layer 3a with a carrier concentration suitable for the emitting characteristics, and being in contact with an active layer 4; an $n^+$-type second layer 3b with a high carrier concentration suitable for an ohmic contact; and an n-type third layer 3c with given carrier concentrations, and that the n-side electrode 9 is provided on the $n^+$-type second layer 3b with a higher carrier concentration than that of the n-type first layer 3a in contact with the active layer 4 (emitting layer).

The regulation of the amount of dopants to be introduced in epitaxially growing the n-type layer 3 results in the formation of the n-type layer 3. For example, when the lamination of the semiconductor layers is conducted by a MOCVD method, an increase in flow rate of a dopant gas to be introduced with a process gas for achieving a desired semiconductor layer such as $SiH_4$ can increase the carrier concentration, while a decrease in flow rate of $SiH_4$ can decrease the carrier concentration. Therefore, the desired semiconductor layers can be obtained in the following manner. Onto the buffer layer 2, the n-type third layer 3c is epitaxially grown to a thickness of the order of 1 to 2 μm so that the carrier concentration becomes, for example, on the order of $1\times10^{17}$ $cm^{-3}$. Subsequently, the flow rate of the dopant gas, $SiH_4$ is increased to further continue the growth, so that the $n^+$-type second layer 3b with a carrier concentration of the order of $1\times10^{19}$ to $5\times10^{19}$ $cm^{-3}$ is grown to a thickness of the order of 2 to 3 μm. Further, the flow rate of the dopant gas, $SiH_4$ is decreased to continue the growth, so that the n-type first layer 3a with a carrier concentration of the order of $1\times10^{18}$ to $9\times10^{18}$ $cm^{-3}$, preferably $1\times10^{18}$ to $3\times10^{18}$ $cm^{-3}$ is grown to a thickness of the order of 1 to 2 μm.

It is sufficient that the thickness of the n-type first layer 3a is provided to such a degree as to perform a carrier confinement function, and a thickness of the order of at least 0.5 μm will suffice. The $n^+$-type second layer 3b is required to be provided with an electrode on the surface exposed by etching so as to obtain an ohmic contact, and hence it is preferably provided to a thickness of the order of 2 μm, or more. The n-type third layer 3c may have either a high or low carrier concentration, and it is permitted even if a dopant is not doped. Accordingly, even if the n-type third layer 3c is not present, and only the n-type first layer 3a and the $n^+$-type second layer 3b are included, it is sufficient that there is provided a structure in which the n-type first layer 3a is in contact with the active layer 4, and the $n^+$-type second layer 3b is provided with the n-side electrode 9.

The semiconductor laminated portion 10 is so constructed that a low temperature buffer layer 2, the n-type layer 3, the active layer 4, and the p-type layer (cladding layer) 5 are successively laminated on a substrate 1. The low temperature buffer layer 2 is made of, for example GaN, and has a thickness of the order of 0.01 to 0.2 μm. The n-type layer 3, which makes a cladding layer, is made of n-type GaN and/or AlGaN based (which denotes that the ratio of Al to Ga is capable of changing variously, and the same shall apply hereinafter) compound semiconductor, and has the above-mentioned structure in which at least the n-type first layer 3a and the $n^+$-type second layer 3b are included. The active layer 4 is made of a material having smaller bandgap energy than that of the cladding layer such as InGaN based compound semiconductor, and has a thickness of the order of 0.05 to 0.3 μm. The p-type layer (cladding layer) 5 is made of a p-type AlGaN based compound semiconductor layer and/or GaN layer, and has a thickness of the order of 0.2 to 1 μm. It is noted that there are some cases where the AlGaN based compound semiconductor is provided on the active layer 4 side of the n-type and p-type cladding layers for enhancing the carrier confinement effect. Therefore, it is also possible that the n-type first layer 3a is formed with an AlGaN based compound semiconductor layer, while the $n^+$-type second layer 3b is formed with a GaN layer.

The p-side electrode 8 made of, for example, a laminated structure of Ti and Au is provided so as to be electrically connected to the p-type layer 5 of the semiconductor laminated portion 10 via a diffused metal layer (not shown), while the n-side electrode 9 made of, for example, a Ti—Al alloy layer is provided on the n type second layer 3b exposed by removing a part of the semiconductor laminated portion 10 by etching, which is formed into a chip from a wafer, resulting in the formation of a LED chip of the present invention.

This semiconductor light emitting device is produced in the following manner. For example, by a metal-organic chemical vapor deposition method (MOCVD method), process gases such as trimethylgallium (TMG) and ammonia (hereinafter, referred to as $NH_3$), and $SiH_4$, or the like as an n-type dopant gas are supplied together with a carrier gas of $H_2$. First, on an insulating substrate 1 made of, for example, sapphire, the low temperature buffer layer 2 made of a GaN layer is grown to a thickness of the order of 0.01 to 0.2 μm at low temperatures of the order of, for example, 400 to 600° C. Then, the flow rate of dopant gas $SiH_4$ is set on the order of 0 to $1\times10^{-4}$ vol % relative to the total amount of gases, and the n-type third layer 3c with the same composition and a carrier concentration of the order of $1\times10^{17}$ $cm^{-3}$ is grown to a thickness of the order of 2 μm. Then, the flow rate of $SiH_4$ is set on the order of $1\times10^{-2}$ vol %, and the $n^+$-type second layer 3b with a carrier concentration of the order of $1\times10^{19}$ $cm^{-3}$ is grown to a thickness of the order of 3 μm. Further, the flow rate of $SiH_4$ is set on the order of $1\times10^{-3}$ vol % and the n-type first layer 3a with a carrier concentration of the order of $1\times10^{18}$ cm$^{-3}$ is grown to a thickness of the order of 2 μm. Then, trimethylindium (TMIn) is added as a process gas to form the active layer 4 made of InGaN based compound semiconductor with a thickness of the order of 0.05 to 0.3 μm.

Next, the process gas of TMIn is changed to trimethylaluminium (TMA), and for example, dimethylzinc (DMZn) is introduced as a dopant gas. Thus, a p-type AlGaN based compound semiconductor layer with a carrier concentration of the order of $1\times10^{17}$ to $1\times10^{18}$ cm$^{-3}$, and with stopping TMA, a p-type GaN layer are laminated to a thickness of the order of 0.1 to 0.5 μm each, resulting in the formation of the p-type layer 5.

Thereafter, for example, Ni and Au are evaporated thereon, followed by sintering to form a diffused metal layer with a thickness of the order of 2 to 100 nm. Subsequently, a part of the stacked semiconductor laminated portion 10 is etched by reactive-ion etching with a chlorine gas, or the like so as to expose the n$^+$-type second layer 3b for forming the n-side electrode 9. Then, a metal film is provided by vacuum evaporation, or the like, followed by sintering to form a p-side electrode 8 and a n-side electrode 9, forming into a chip. Consequently, the semiconductor light emitting device shown in FIG. 1 can be obtained.

According to the semiconductor light emitting device of the present invention, while the n-type layer on the emitting layer (the active layer 4 in the example of FIG. 1) side is formed with the n-type first layer having an optimum carrier concentration for the carrier confinement effect, the portion to be provided with the n-side electrode is formed with the n$^+$-type second layer having a high carrier concentration. Accordingly, the electrode can be provided with ensuring a good ohmic contact while having excellent emitting characteristics. It is noted that the p-side electrode is provided via the diffused metal layer, and hence the carrier concentration of the p-type layer for an ohmic contact does not appreciably present a problem. As a result of that, the contact resistance is reduced to obtain a semiconductor light emitting device with a low forward voltage $V_f$. This enables the improvement in light emitting efficiency and a reduction in power-supply voltage.

In the example described above, the Ti—Al alloy layer is used as the n-side electrode 9. However, since the portion of the n-type layer 3 to be provided with the n-side electrode 9 has a high carrier concentration, which improves the ohmic contact characteristics, other Ti—Au, Ni—Au, Ti—Pt, Au, Pt, and the like can be used.

Figure 2:
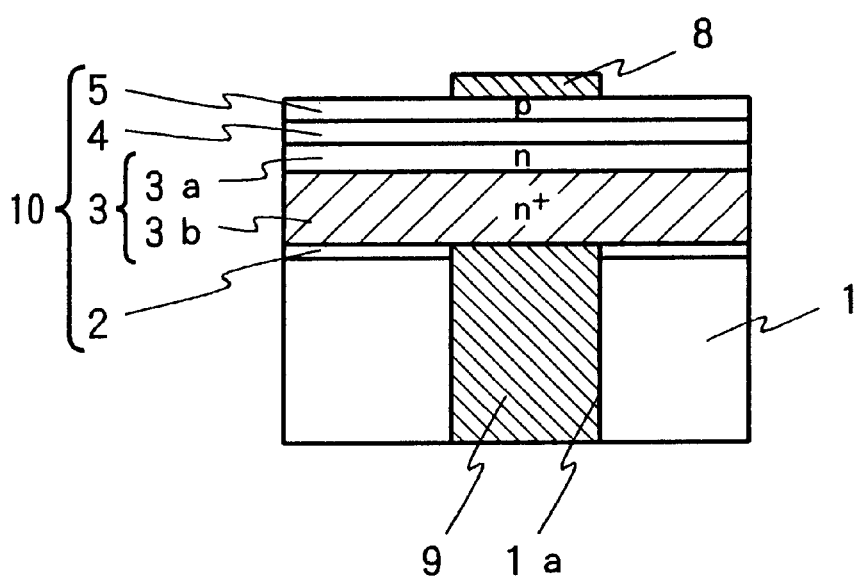
FIG. 2 shows a cross-sectional view illustrating a LED chip of a modified embodiment of the semiconductor light emitting device of FIG. 1.

FIG. 2 is a diagram illustrating the cross-sectional shape of a chip of a semiconductor light emitting device showing a modified embodiment of FIG. 1. In this example, the n-side electrode 9 is provided not by removing a part of the semiconductor laminated portion 10 with etching to expose the n$^+$-type second layer 3b, but by removing a part of the substrate 1 with etching to expose the n$^+$-type second layer 3b, so that the n-side electrode 9 is provided on the substrate 1 side. In this case, it is more preferable that there is no n-type third layer. However, in the case where the n-type third layer 3c having a low carrier concentration is provided, etching is conducted to the n-type third layer 3c as well as the substrate 1 to provide a contact hole 1a so as to expose the n$^+$-type second layer 3b. It is noted that the same elements as those in FIG. 1 are given the same reference characters, and the description thereof is omitted.

Figure 3:
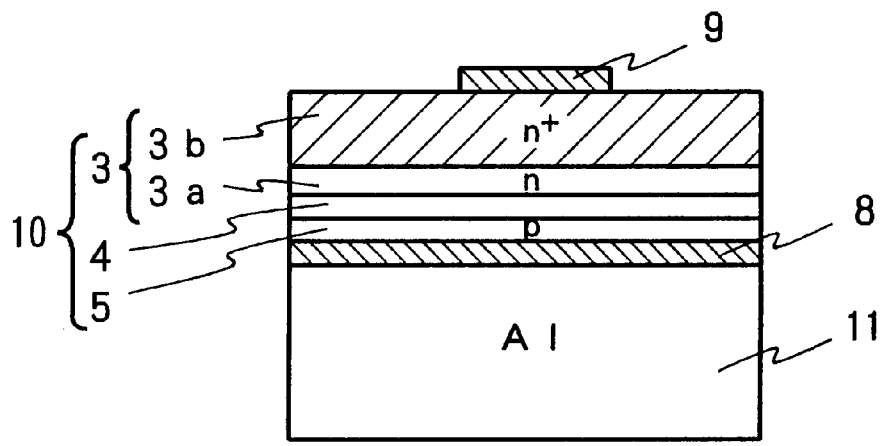
FIG. 3 shows a cross-sectional view illustrating a LED chip of the other modified embodiment of the semiconductor light emitting device of FIG. 1.
Figure 4:
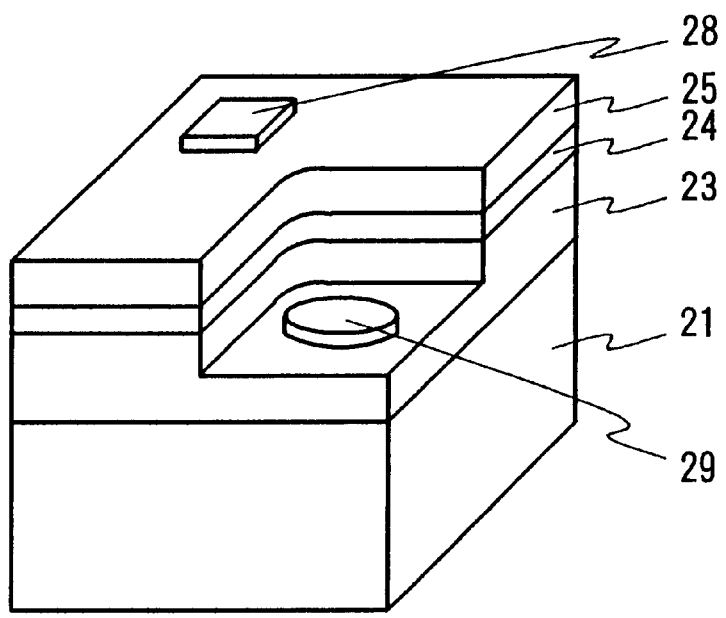
FIG. 4 shows a perspective view illustrating an LED chip of a conventional semiconductor light emitting device.

FIG. 3 is a diagram showing a still other modified embodiment. In this embodiment, a metal plate 11 made of Al, or the like is provided on the p-type layer 5 side to serve as a new substrate. Further, a sapphire substrate in stacking semiconductor layers is removed by polishing, or the like. The n$^+$-type second layer 3b exposed by the removal is provided with the n-side electrode 9. Also in a semiconductor light emitting device having such a structure, the n-type layer 3 includes an n-type first layer 3a formed with a carrier concentration in accordance with the emitting characteristics on the active layer 4 side, and an n$^+$-type second layer 3b with a high carrier concentration on the side to be provided with the p-side electrode 9, thereby obtaining the same effects as described above. It is noted that the same elements as those in FIG. 1 are given the same reference characters, and the description thereof is omitted.

In each of the above embodiments, the active layer 4 is sandwiched between the n-type layer 3 and the p-type layer 5, and the active layer 4 serves as an emitting layer, thus implementing a double hetero structure. However, even a semiconductor light-emitting device of pn junction structure in which the n-type layer is in direct contact with the p-type layer is constructed in the same manner as described above. In this case, an emitting layer is formed at the pn junction area, and the n-type layer is so constructed that an n-type first layer is formed with a carrier concentration in accordance with the emitting characteristics on the pn junction region side, while the portion to be provided with an electrode becomes the n$^+$-type second layer. The material for the semiconductor layers laminated in each of the above embodiments is one example, and the present invention is not limited thereto.

According to the present invention, while maintaining the emitting characteristics, the ohmic contact between an electrode and a semiconductor layer is improved, resulting in a semiconductor light emitting device with a low operating voltage and excellent light emitting efficiency. Further, a good ohmic contact can be obtained with ease, presenting an effect that the limit on the materials for the n-side electrode metal is eased to expand the range from which the electrode metal is selected.

Although preferred embodiments have been described in some detail, it is to be understood that certain changes can be made by those skilled in the art without departing from the spirit and scope of the invention as defined by the appended claims.

What is claimed is:

1. A semiconductor light emitting device comprising:
   a substrate;
   a semiconductor laminated portion in which gallium nitride based compound semiconductor layers including an n-type layer, an active layer and a p-type layer are laminated so as to form an emitting layer on the substrate; and
   an n-side electrode and a p-side electrode being provided so as to be electrically connected to said n-type layer and said p-type layer of said semiconductor laminated portion, respectively,
   wherein said n-type layer is formed of at least first and second layers, wherein a carrier concentration of the first layer to be provided with the n-side electrode is higher than a carrier concentration of the second layer which is in contact with the active layer.

2. A semiconductor light emitting device according to claim 1, wherein said n-side electrode is provided on said n-type layer of a region with a high carrier concentration exposed by etching a part of said semiconductor laminated portion across said active layer.

3. A semiconductor light emitting device according to claim 1, wherein said n-side electrode is provided so as to be connected to said n-type layer of a region with a high carrier concentration exposed by etching at least a part of said substrate on which said semiconductor laminated portion is formed.

4. A semiconductor light emitting device according to claim 1, wherein the carrier concentration of said second layer is in the range of $1\times10^{18}$ to $9\times10^{18}$ cm$^{-3}$, while the carrier concentration of said first layer to be provided with said n-side electrode is in the range of $1\times10^{19}$ to $5\times10^{19}$ cm$^{-3}$.

5. A semiconductor light emitting device according to claim 4, wherein the carrier concentration of said second layer is in the range of $1\times10^{18}$ to $3\times10^{18}$ cm$^{-3}$.

6. A semiconductor light emitting device according to claim 1, wherein a metal substrate is provided so as to be electrically connected to said p-type layer side of said semiconductor laminated portion to be said p-side electrode, while an entire surface of said n-type layer with a high carrier concentration is exposed to be provided with said n-side electrode thereon.

* * * * *